(12) United States Patent
Liu et al.

(10) Patent No.: US 11,613,801 B2
(45) Date of Patent: Mar. 28, 2023

(54) MASKS AND DISPLAY DEVICES

(71) Applicant: Kunshan Go-Visionox Opto-Electronics Co., Ltd., Kunshan (CN)

(72) Inventors: Mingxing Liu, Kunshan (CN); Xuliang Wang, Kunshan (CN); Xuan Zhang, Kunshan (CN); Shuaiyan Gan, Kunshan (CN); Feng Gao, Kunshan (CN)

(73) Assignee: KUNSHAN GO-VISIONOX OPTO-ELECTRONICS CO., LTD., Kunshan (CN)

( * ) Notice: Subject to any disclaimer, the term of this patent is extended or adjusted under 35 U.S.C. 154(b) by 871 days.

(21) Appl. No.: 16/441,022

(22) Filed: Jun. 14, 2019

(65) Prior Publication Data

US 2019/0292647 A1   Sep. 26, 2019

Related U.S. Application Data

(63) Continuation of application No. PCT/CN2018/113114, filed on Oct. 31, 2018.

(30) Foreign Application Priority Data

May 14, 2018 (CN) .......................... 201820707909.4
May 14, 2018 (CN) .......................... 201820714906.3

(51) Int. Cl.
*C23C 14/04* (2006.01)
*H01L 51/56* (2006.01)
*H01L 51/00* (2006.01)

(52) U.S. Cl.
CPC ............ *C23C 14/042* (2013.01); *H01L 51/56* (2013.01); *H01L 51/0011* (2013.01)

(58) Field of Classification Search
None
See application file for complete search history.

(56) References Cited

U.S. PATENT DOCUMENTS

| 10,026,785 B2 | 7/2018 | Bai et al. |
| 2004/0238491 A1 | 12/2004 | Berasi et al. |

(Continued)

FOREIGN PATENT DOCUMENTS

| CN | 103205675 A | 7/2013 |
| CN | 103904105 A | 7/2014 |

(Continued)

OTHER PUBLICATIONS

English translation of Written Opinion for PCT/CN2018/113114.*

(Continued)

*Primary Examiner* — Charles Capozzi
(74) *Attorney, Agent, or Firm* — Kilpatrick Townsend & Stockton

(57) ABSTRACT

The mask includes an evaporation surface and a glass surface facing away from the evaporation surface. The mask is provided with a plurality of evaporation holes distributed in an array. The evaporation hole penetrates the evaporation surface and the glass surface, and the evaporation hole includes a first opening on the evaporation surface and a second opening on the glass surface. An orthographic projection of the first opening on the glass surface is a first projection opening, and the first projection opening covers the second opening. An interval between the first projection opening and the second opening in a first direction of tensioning the mask is a first interval. An interval between the first projection opening and the second opening in a second direction perpendicular to the first direction is a second interval. The second interval is less than the first interval.

18 Claims, 5 Drawing Sheets

(56) References Cited

U.S. PATENT DOCUMENTS

| | | | | |
|---|---|---|---|---|
| 2009/0108502 A1* | 4/2009 | Kogetsu | ................ | H01M 4/661 |
| | | | | 428/131 |
| 2017/0130320 A1* | 5/2017 | Kobayashi | ............ | C23C 14/042 |
| 2018/0287064 A1 | 10/2018 | Matsueda et al. | | |
| 2019/0144988 A1* | 5/2019 | Mizumura | ........... | B23K 26/066 |
| | | | | 118/721 |
| 2019/0252469 A1* | 8/2019 | Xiao | .................... | H01L 27/326 |

FOREIGN PATENT DOCUMENTS

| | | |
|---|---|---|
| CN | 104988458 A | 10/2015 |
| CN | 104362170 B | 4/2017 |
| CN | 108026628 A | 5/2018 |
| CN | 108695361 A | 10/2018 |
| JP | 2011054290 A | 3/2011 |
| KR | 20180049463 A | 5/2018 |
| WO | 2017045122 A1 | 3/2017 |

OTHER PUBLICATIONS

English translation of International Search Report for PCT/CN2018/113114.*

English translation of JP2011054290.*

* cited by examiner

MASKS AND DISPLAY DEVICES

CROSS-REFERENCES TO RELATED APPLICATIONS

This application is a continuation application of International Application PCT/CN2018/113114, filed on Oct. 31, 2018, which claims the priority benefit of Chinese Patent Application No. 201820707909.4, titled "MASKS, DISPLAY DEVICES, DISPLAY PANELS, AND DISPLAY TERMINALS" and filed on May 14, 2018, and Chinese Patent Application No. 201820714906.3, titled "MASKS" and filed on May 14, 2018. The entireties of these applications are incorporated by reference herein for all purposes.

BACKGROUND

At present, an organic light-emitting diode (OLED) uses vacuum evaporation technology to manufacture an organic light-emitting layer. During a manufacturing process of a device, organic materials are deposited on a substrate located above an evaporation source by high-temperature evaporation. In order to evaporate the organic materials to a specific location as designed, a high-precision metal mask is required. A pre-designed effective opening area is provided on the mask (i.e., the high-precision metal mask), and the organic materials can be deposited onto a back plate through the effective opening area to form a predetermined pattern. A plurality of evaporation holes are distributed in the effective opening area to allow the evaporation material to pass through.

SUMMARY

Accordingly, the present disclosure provides masks to solve the problem that organic materials used for evaporation are deviated from a designed pixel position on a backplane, and improves the performance of the product.

According to one aspect of the present disclosure, a mask is provided, which includes an evaporation surface and a glass surface facing away from the evaporation surface. The mask is provided with a plurality of evaporation holes distributed in an array. The evaporation hole penetrates the evaporation surface and the glass surface, and the evaporation hole includes a first opening on the evaporation surface and a second opening on the glass surface. An orthographic projection of the first opening on the glass surface is a first projection opening, and the first projection opening covers the second opening;

An interval between the first projection opening and the second opening in a first direction of tensioning the mask is a first interval. An interval between the first projection opening and the second opening in a second direction perpendicular to the first direction is a second interval, the second interval is less than the first interval.

In the mask of the above aspect, the evaporation hole is used for evaporation of materials, and the evaporation hole includes a first opening and a second opening on the evaporation surface and the glass surface, respectively. The first projection opening of the first opening on the glass surface covers the second opening, that is, the first opening is greater than the second opening. In addition, the second interval is less than the first interval, that is, the interval between the first opening and the second opening in the second direction is less than the interval between the first opening and the second opening in the first direction. Therefore, an opening range of the first opening in the second direction is less than an opening range thereof in the first direction, such that the interval between the adjacent two first openings of the mask in the second direction is greater than the interval between the adjacent two first openings in the first direction. A transmission passage through which a tensile force is transmitted along the first direction is widened, so that a force bearing area on the mask becomes larger, the transmission of the tensile force becomes more smooth, and the mask is not easily wrinkled under the tensile force. Therefore, the evaporation hole is prevented from being misplaced from the designed pixel position on the backplane, thereby avoiding color mixing of the organic materials for evaporation and improving the performance of the product.

In one of the exemplary embodiments, the evaporation hole includes a first etching hole and a second etching hole. The first etching hole defines the first opening, and the second etching hole defines the second opening. The first etching hole gradually shrinks in a direction from the first opening towards the second opening, and the second etching hole gradually shrinks in a direction from the second opening towards the first opening and is in communication with the first etching hole.

In one of the exemplary embodiments, each of the first etching hole and the second etching hole has a rectangular cross-section along a plane parallel to the evaporation surface, respectively.

In one of the exemplary embodiments, the first opening has two first sides and two second sides. The two first sides are oppositely spaced apart from each other along the first direction. The two second sides are oppositely spaced apart from each other along the second direction and are connected between the two first sides. The second opening has two third sides and two fourth sides, the two third sides are oppositely spaced apart from each other along the first direction. The two fourth sides are oppositely spaced apart from each other along the second direction and are connected between the two third sides. The first interval is a vertical interval between the first side and the third side in the first direction, and the second interval is a vertical interval between the second side and the fourth side in the second direction.

In one of the exemplary embodiments, the evaporation hole further includes a first inclined wall connected between the first side and the third side and a second inclined wall connected between the second side and the fourth side. An inclination angle of the first inclined wall with respect to a thickness direction of the mask is a first inclination angle. An inclination angle of the second inclined wall with respect to the thickness direction of the mask is a second inclination angle, and the first inclination angle is greater than the second inclination angle.

In one of the exemplary embodiments, each of the second openings includes a centerline parallel to the first direction. A plurality of the second openings are distributed in a plurality of rows. The centerlines of the second openings in odd rows coincide, and the centerlines of the evaporation holes in even rows coincide. The centerlines of the evaporation holes in the odd rows and the centerlines of the evaporation holes in the even rows are staggered from each other in the second direction.

According to another aspect of the present disclosure, a mask is provided, which includes an evaporation surface and a glass surface facing away from the evaporation surface. The mask is provided with a plurality of evaporation holes distributed in an array. The evaporation hole penetrates the evaporation surface and the glass surface, and the evaporation hole includes a first opening on the evaporation surface and a second opening on the glass surface. An orthographic projection of the first opening on the glass surface is a first projection opening, and the first projection opening covers the second opening;

an interval between the first projection opening and the second opening in a first direction of tensioning the mask is a first interval, an interval between the first projection opening and the second opening in a second direction perpendicular to the first direction is a second interval;

the plurality of evaporation holes are distributed in a plurality of rows, the second interval of the evaporation hole in even rows is less than the first interval, and the second interval of the evaporation hole in odd rows is equal to the first interval. Or the second interval of the evaporation hole in even rows is equal to the first interval, and the second interval of the evaporation hole in odd rows is less than the first interval.

According to another aspect of the present disclosure, a mask is provided. The mask is provided with a plurality of evaporation holes arranged in rows along a first direction and a second direction perpendicular to the first direction. The evaporation holes of adjacent two rows of evaporation holes in the first direction are staggered from each other in the second direction, and an interval in the first direction between the adjacent two evaporation holes in the first direction is less than an interval in the second direction.

In one of the exemplary embodiments, the evaporation hole has a chamfered diamond shape having two diagonal lines extending along the first direction and the second direction, respectively.

In one of the exemplary embodiments, the evaporation hole is chamfered to have an arc first rounded corner in the first direction and an arc second rounded corner in the second direction.

In one of the exemplary embodiments, a radius of curvature of the second rounded corner is greater than a radius of curvature of the first rounded corner.

In one of the exemplary embodiments, the radius of curvature of the second rounded corner is less than twice of the radius of curvature of the first rounded corner.

In one of the exemplary embodiments, the evaporation hole is chamfered to have an included angle transition portion in the second direction. The included angle transition portion includes a first side, a second side, and a third side. The first side and the second side are two adjacent sides of the diamond, and the third side connects the first side and the second side.

In one of the exemplary embodiments, a length of the third side is greater than 0.1 times of a side length of the diamond and less than 0.5 times of the side length of the diamond.

In one of the exemplary embodiments, the evaporation hole is chamfered to have an arc third rounded corner in the first direction.

In a process of using a mask of the above aspects, a tension force is applied to the mask in the first direction, and the mask is tensioned and welded on a frame. During tensioning, the mask is subjected to a larger force in the first direction, and the second interval between the adjacent two evaporation holes in the second direction is greater than the first interval in the first direction, providing a wider transmission passage for the tensile force transmitted along the first direction, so that the force bearing area on the mask becomes larger, the transmission of the tensile force becomes more smooth, and the mask is not easily wrinkled under the tensile force. Therefore, the evaporation hole is prevented from being misplaced from the designed pixel position on the backplane, thereby avoiding color mixing of the organic materials for evaporation and improving the performance of the product.

The present disclosure further provides a display device manufactured by evaporation of a mask of any of the above aspects.

The present disclosure further provides a display panel, which includes a substrate, the above display device, and a packaging layer. The display device is disposed on the substrate, and the packaging layer is packaged outside the display device.

The present disclosure further provides a display terminal including the above display panel.

DETAILED DESCRIPTION OF THE INVENTION

Exemplary embodiments of the disclosure are described more fully hereinafter with reference to the accompanying drawings. The various exemplary embodiments of the disclosure may, however, be embodied in many different forms and should not be construed as limited to the exemplary embodiments set forth herein. Rather, these exemplary embodiments are provided so that this disclosure will be thorough and complete, and will fully convey the scope of the disclosure to those skilled in the art.

It should be understood that when an element is referred to as being "connected" or "coupled" to another element, it can be directly connected or coupled to the other element or intervening elements may be present. In contrast, if an element is referred to as being "directly connected" or "directly coupled" to another element, there are no intervening elements present.

When a mask in the related art is used, there is a problem that organic materials used for evaporation are deviated from a designed pixel position on a backplane. The fundamental reason for this problem is that when the mask is provided with a plurality of evaporation holes having larger openings, the transmission of force is not smooth enough, and the mask is easily wrinkled, thereby resulting in different extension degrees of the respective evaporation holes on the mask, and the phenomenon that the evaporation hole on the mask is misplaced from the designed pixel position on a backplane glass and the organic materials is deviated during the evaporation process is present.

Figure 1:
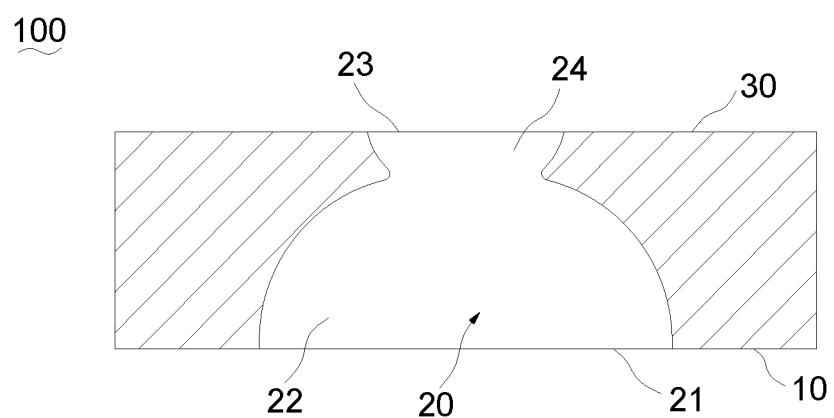
FIG. 1 is a schematic view of a mask according to an exemplary embodiment of the present disclosure.
Figure 2:
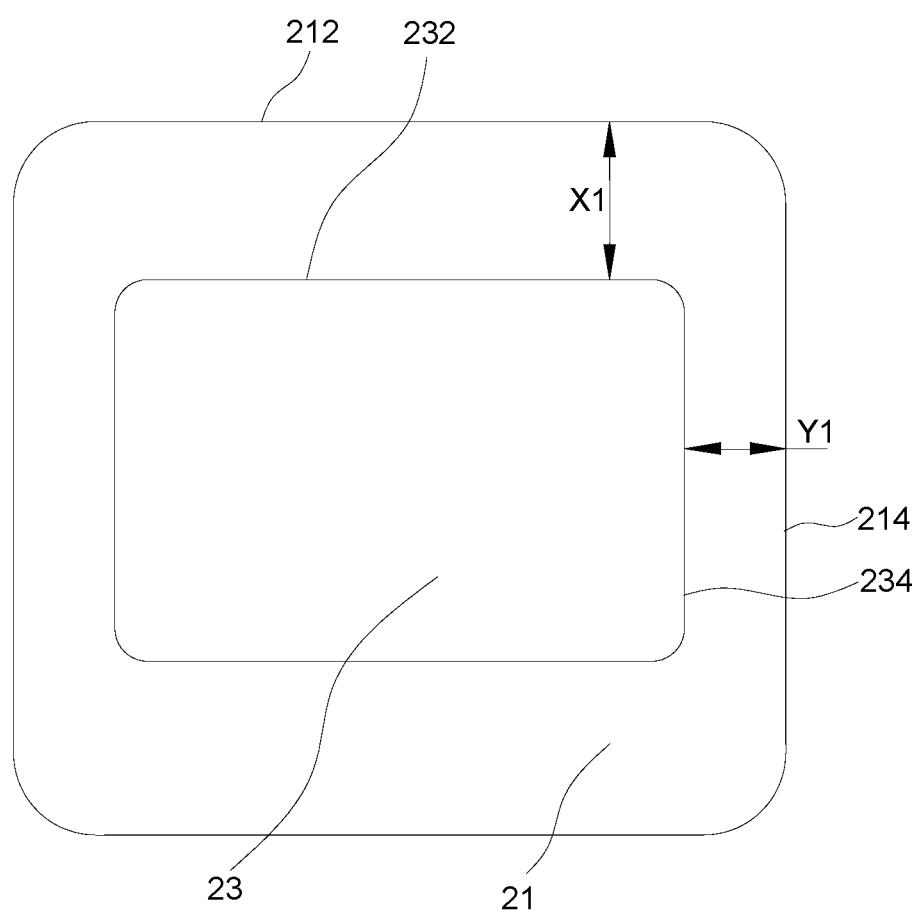
FIG. 2 is schematic view of the evaporation hole in the mask of FIG. 1.

Referring to FIG. 1 to FIG. 2, an exemplary embodiment of the present disclosure provides a mask 100 including an evaporation surface 10 and a glass surface 30 facing away from the evaporation surface 10. The mask 100 is provided with a plurality of evaporation holes 20 distributed in an array. The evaporation holes 20 penetrate the evaporation surface 10 and the glass surface 30, and each of the evaporation holes 20 includes a first opening 21 on the evaporation surface 10 and a second opening 23 on the glass surface 30. An orthographic projection of the first opening 21 on the glass surface 30 is a first projection opening (not shown), and the first projection opening covers the second opening 23. An interval between the first projection opening and the second opening 23 in a first direction of tensioning the mask 100 is a first interval X1, an interval between the first projection opening and the second opening 23 in a second direction perpendicular to the first direction is a second interval Y1. The second interval Y1 is less than the first interval X1.

In the aforementioned mask 100, the evaporation hole 20 is used for evaporation of materials, and the evaporation hole 20 includes the first opening 21 and the second opening 23 on the evaporation surface 10 and the glass surface 30, respectively. The first projection opening of the first opening 21 on the glass surface 30 covers the second opening 23, that is, the first opening 21 is greater than the second opening 23. In addition, the second interval Y1 is less than the first interval X1, that is, the interval between the first opening 21 and the second opening 23 in the second direction is less than the interval between the first opening 21 and the second opening 23 in the first direction. Therefore, an opening range of the first opening 21 in the second direction is less than an opening range thereof in the first direction, such that the interval between the adjacent two first openings 21 of the mask 100 in the second direction is greater than the interval between the adjacent two first openings 21 in the first direction. A transmission passage through which a tensile force is transmitted along the first direction is widened, so that a force bearing area on the mask 100 becomes larger, the transmission of the tensile force becomes more smooth, and the mask 100 is not easily wrinkled under the tensile force. Therefore, the evaporation hole is prevented from being misplaced from the designed pixel position on the backplane, thereby avoiding color mixing of the organic materials for evaporation and improving the performance of the product.

In one exemplary embodiment, the plurality of evaporation holes 20 are distributed in a plurality rows. The second intervals Y1 of the evaporation holes 20 in even rows are less than the first intervals X1, and the second intervals Y1 of the evaporation holes 20 in odd rows are equal to the first intervals X1. Alternatively, the second intervals Y1 of the evaporation holes 20 in even rows are equal to the first intervals X1, and the second intervals Y1 of the evaporation holes 20 in odd rows are less than the first intervals X1. That is, in the plurality of rows of evaporation holes 20, the size of the second interval Y1 is changed at intervals. For example, the second interval of the evaporation hole 20 in odd rows is changed, or the second interval of the evaporation hole 20 in even rows is changed, so that the second interval Y1 is less than the first interval X1, thereby further reducing the opening range of the first opening 21 in the second direction and increasing the interval between the adjacent two first openings 21 in the second direction. In addition, the transmission passage through which the tensile force is transmitted along the first direction is widened, the force bearing area on the mask 100 becomes larger, and the transmission of the tensile force becomes more smooth.

In one exemplary embodiment, the evaporation hole 20 includes a first etching hole 22 and a second etching hole 24. The first etching hole 22 has the first opening 21, and the second etching hole 24 has the second opening 23. The first etching hole 22 gradually shrinks in a direction from the first opening 21 towards the second opening 23, and the second etching hole 24 gradually shrinks in a direction from the second opening 23 towards the first opening 21 and is in communication with the first etching hole 22. In an actual production process, the first etching hole 22 is etched on the evaporation surface 10 of the mask 100, and the second etching hole 24 is etched on the glass surface 30 of the mask 100 opposite to the evaporation surface 10. In addition, the first opening 21 of the first etching hole 22 and the second opening 23 of the second etching hole 24 are both etched according to a predetermined size, and the evaporation hole 20 can be finally obtained by etching the first etching hole 22 and the second etching hole 24 from the opposite two surfaces, respectively.

Specifically, during the etching process, the etching may be performed twice. During a first etching, the second etching hole 24 having a smaller volume is first etched, and a portion of the first etching hole 22 is etched, and then a spacer is laid in the second etching hole 24, and finally a second etching is performed. During the second etching, the first etching hole 22 is continuously etched until it is in communication with the second etching hole 24, and a connecting portion between the first etching hole 22 and the second etching hole 24 is made smoother by the spacer.

In the present exemplary embodiment, each of the first etching hole 22 and the second etching hole 24 has a rectangular cross-section along a plane parallel to the evaporation surface 10. It should be understood that, in alternative exemplary embodiments, the cross-section of the first etching hole 22 and the second etching hole 24 may be other shapes such as a diamond shape along the plane parallel to the evaporation surface 10, which is not limited hereto.

In one exemplary embodiment, the first opening 21 has two first sides 212 and two second sides 214. The two first sides 212 are oppositely spaced apart from each other along the first direction. The two second sides 214 are oppositely spaced apart from each other along the second direction and are connected between the two first sides 212. The second opening 23 has two third sides 232 and two fourth sides 234. The two third sides 232 are oppositely spaced apart from each other along the first direction. The two fourth sides 234 are oppositely spaced apart from each other along the second direction and are connected between the two third sides 232. The first interval X1 is a vertical interval between the first side 212 and the third side 232 along the first direction, and the second interval Y1 is a vertical interval between the second side 214 and the fourth side 234 along the second direction. That is, the first opening 21 and the second opening 23 are arranged in a rectangular shape, the first interval X1 can be obtained by calculating the vertical interval between the first side 212 and the third side 232 in the first direction of tensioning the mask 100, and the second interval Y1 can be obtained by calculating the vertical interval between the second side 214 and the fourth side 234 in the second direction. The vertical interval between the first side 212 and the third side 232 in the first direction is a distance between the projection of the first side 212 on the glass surface 30 and the third side 232. The vertical interval between the second side 214 and the fourth side 234 is a distance between the projection of the second side 214 on the glass surface 30 and the fourth side 234.

In one exemplary embodiment, the evaporation hole 20 includes a first inclined wall connected between the first side 212 and the third side 232 and a second inclined wall connected between the second side 214 and the fourth side 234. An inclination angle of the first inclined wall with respect to a thickness direction of the mask 100 is a first inclination angle, and an inclination angle of the second inclined wall with respect to the thickness direction of the mask 100 is a second inclination angle. The first inclination angle is greater than the second inclination angle. That is, the opening range of the first opening 21 in the first direction is larger, and the opening range of the first opening 21 in the second direction is smaller. Therefore, the interval between the adjacent two first openings 21 in the second direction is larger, and the passage in which the tensile force is transmitted along the first direction is widened, so that the transmission of the tensile force becomes more smooth.

Specifically, the mask 100 is manufactured by an electroforming process, and a shape of the evaporation hole 20 is matched with a shape of an electroforming mold core. Therefore, in a process of manufacturing the aforementioned mask 100 by the electroforming process, the electroforming mold core includes two first side walls spaced apart in the first direction and two second side walls spaced apart in the second direction, such that an inclination angle of the first side wall with respect to a height direction is equal to the first inclination angle A and an inclination angle of the second side wall with respect to the height direction is equal to the second inclination angle B. Since the first inclination angle A is greater than the second inclination angle B, the inclination angle of the first side wall with respect to the height direction is greater than the inclination angle of the second side wall with respect to the height direction, and the evaporation hole 20 having the aforementioned first inclined wall and the second inclined wall can be obtained after electroforming.

Figure 3:
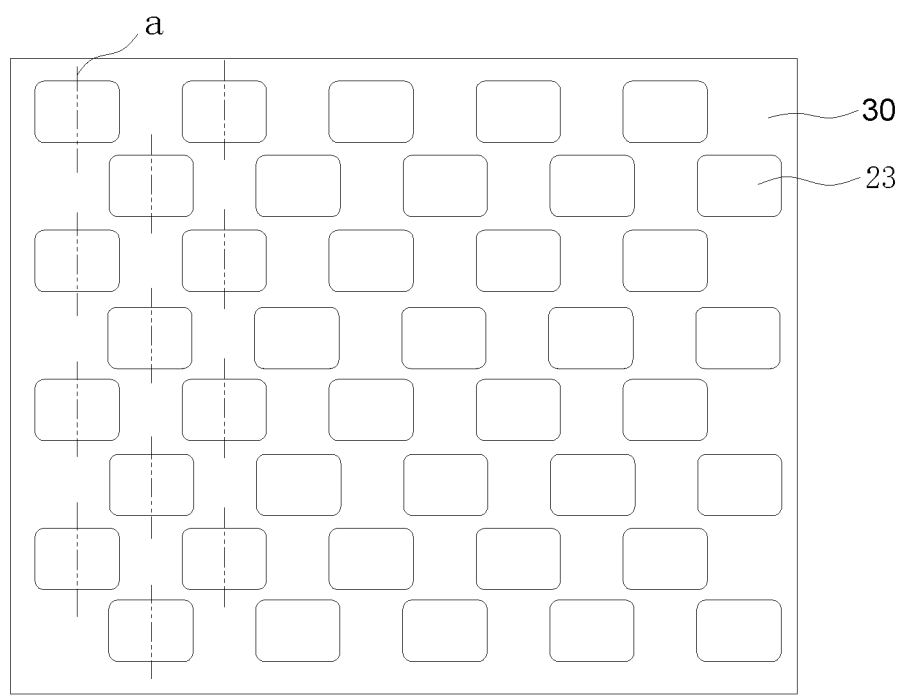
FIG. 3 is schematic view showing an arrangement of the second opening in the mask of FIG. 1.

Referring to FIG. 3, in one exemplary embodiment, each of the second openings 23 includes a centerline a parallel to the first direction. The plurality of second openings 23 are distributed in a plurality of rows. The centerlines a of the second openings 23 in odd rows coincide, and the centerlines a of the second openings 23 in even rows coincide. The centerlines a of the second openings 23 in the odd rows and the centerlines a of the second openings 23 in the even rows are staggered from each other in the second direction. In this case, the plurality of rows of second openings 23 are staggered to each other to balance the strength of each area of the mask 100 in the second direction.

Figure 4:
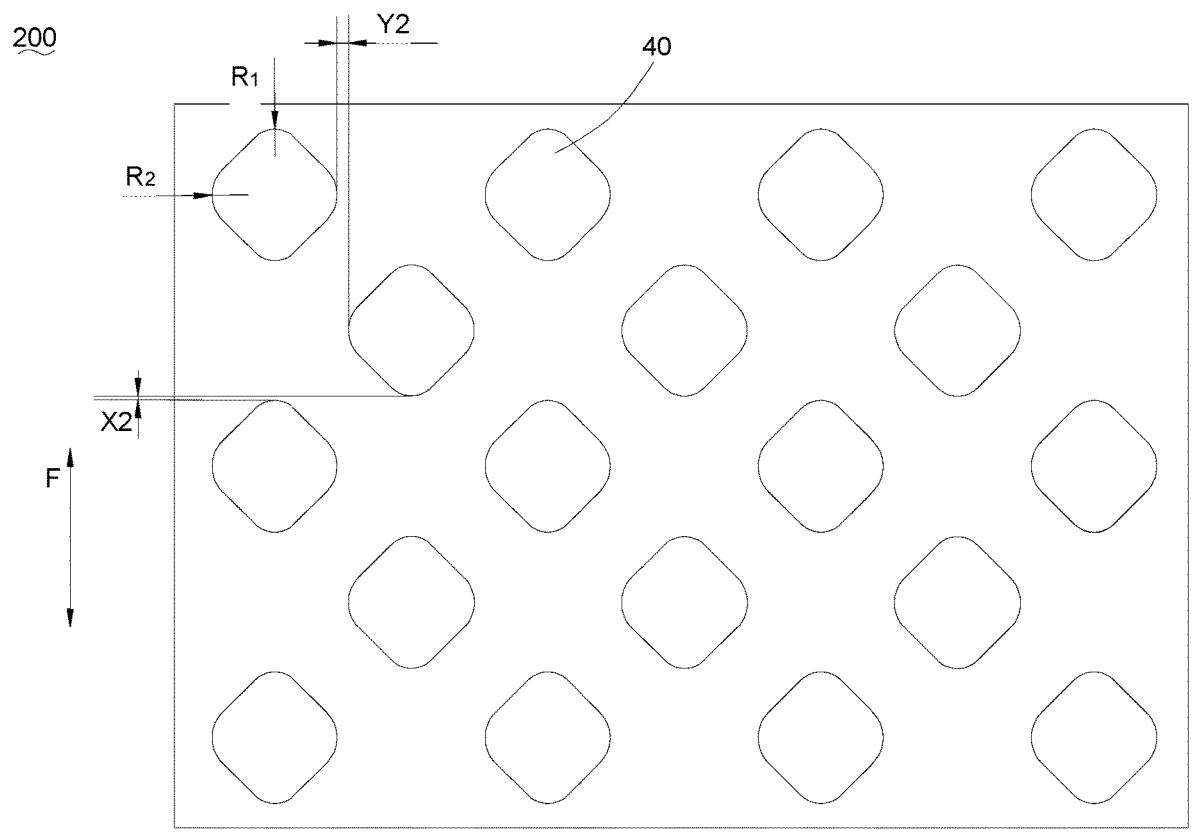
FIG. 4 is a schematic view of a mask according to another exemplary embodiment of the present disclosure.

Referring to FIG. 4, in another exemplary embodiment of the present disclosure, a mask 200 is provided. The mask 200 is provided with a plurality of evaporation holes 40 arranged in a plurality of rows. An interval between the adjacent two evaporation holes 40 in a first direction of tensioning the mask 200 (a direction represented by F in the figures) is a first interval X2. An interval between the adjacent two evaporation holes 40 in a second direction perpendicular to the first direction is a second interval Y2. The first interval X2 is less than the second interval Y2.

In a process of using the aforementioned mask 200, a tension force is applied to the mask 200 in the first direction (shown as F in the figures), and the mask 200 is tensioned and welded on a frame. During tensioning, the mask 200 is subjected to a larger force in the first direction, and the second interval Y2 between the adjacent two evaporation holes 40 in the second direction is greater than the first interval X2 in the first direction, which provides a wider transmission passage for the tensile force transmitted along the first direction, so that the force bearing area on the mask becomes larger, the transmission of the tensile force becomes more smooth, and the mask is not easily sagged and wrinkled under the tensile force. Therefore, the evaporation hole is prevented from being misplaced from the designed pixel position on the backplane, thereby avoiding color mixing of the organic materials for evaporation and improving the performance of the product.

Preferably, the evaporation hole 40 has a substantially diamond shape (a chamfered diamond shape in the figures), and the plurality of diamond-shaped evaporation holes 40 are arranged in a plurality of rows. In addition, the evaporation holes 40 in the adjacent two rows of evaporation holes 40 are staggered from each other and arranged at an equal distance, so that the strength of the mask 200 in the second direction is more uniform.

Referring to FIG. 4, a first diagonal line and a second diagonal line (not shown) of the substantially diamond-shaped evaporation hole 40 extend along the first direction and the second direction, respectively. Four apexes of the evaporation hole 40 are chamfered into arc rounded corners. The evaporation hole 40 includes a first rounded corner $R_1$ in the first direction and a second rounded corner $R_2$ in the second direction. A radius of curvature of the second rounded corner $R_2$ is greater than a radius of curvature of the first rounded corner $R_1$, so that a distance between the second rounded corner $R_2$ and a center of the diamond-shaped evaporation hole 40 is small, an opening range of the evaporation hole 40 in the second direction is small, and the second interval Y2 between the adjacent two evaporation holes 40 in the second direction is larger, which provides a wider transmission passage for the tensile force transmitted along the first direction. The force bearing area of the mask 40 becomes larger, the transmission of the tensile force becomes more smooth, and the phenomenon that the tensile force causes the wrinkles of the mask 200 is reduced. In addition, the mask can be used to improve the evaporation yield and increase the producer price index (PPI) of the product obtained by evaporation.

Specifically, the evaporation hole 40 includes two opposite second rounded corners $R_2$ in the second direction, and at least one of the two second rounded corners $R_2$ has a radius of curvature greater than the radius of curvature of the first rounded corner $R_1$. For the diamond-shaped evaporation hole 40, when the radius of curvature of the second rounded corner $R_2$ is greater than the radius of curvature of the first rounded corner $R_1$, the opening range of the evaporation hole 40 in the second direction becomes small, the interval between the adjacent two evaporation holes 20 in the second direction becomes large, so that a wider tension transmission passage can be provided.

In addition, the radii of curvature of the second rounded corners $R_2$ on the same side of the evaporation hole 40 are greater than the radius of curvature of the first rounded corner $R_1$. For example, the radius of curvature of the second rounded corner $R_2$ on the left side of each of the evaporation holes 40 is greater than the radius of curvature of the first rounded corner $R_1$, or the radius of curvature of the second rounded corner $R_2$ on the right side of each of the evaporation holes 40 is greater than the radius of curvature of the first rounded corner $R_1$, the second interval Y2 of the mask 200 in the second direction is uniformly widened, and the transmission of the force is more uniform. Alternatively, the radius of curvature of the two second rounded corners $R_2$ on both sides of the plurality of evaporation holes 40 is greater than the radius of curvature of the first rounded corner $R_1$. For example, referring to FIG. 4, the second rounded corner $R_2$ on the left and right sides of each of the evaporation holes 40 becomes larger, and an interval between both sides of the evaporation hole 40 and the adjacent evaporation hole 40 becomes larger, thus further widening the second interval Y2.

Specifically, the radius of curvature of the second rounded corner $R_2$ is less than twice of the radius of curvature of the first rounded corner $R_1$, while the radius of curvature of the second rounded corner $R_2$ is greater than the radius of curvature of the first rounded corner $R_1$, that is, $R_1<R_2<2R_1$, so that the radius of curvature of the second rounded corner $R_2$ is increased to a moderate amount to achieve a superior wrinkle-removing effect. Optionally, the first rounded corner $R_1=12$ μm, the second rounded corner $R_2=16$ μm, the first interval X2=1.49 μm, and the second interval Y2=5.23 μm. In such arrangement, the simulation results show that the wrinkles are reduced by 30% compared to the case where the rounded corners R of the evaporation holes are both 12 μm and the intervals between the adjacent two evaporation holes in both the first direction and the second direction are 1.49 μm.

Figure 5:
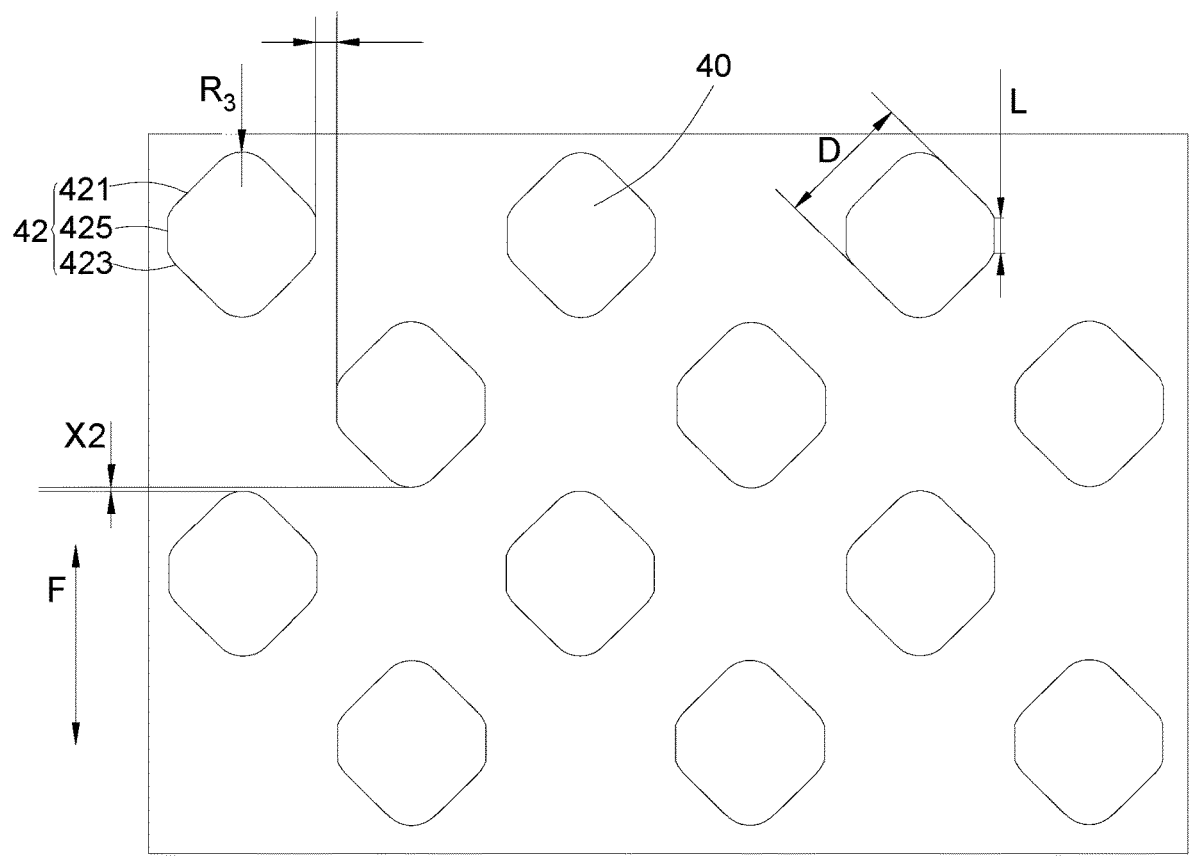
FIG. 5 is a schematic view of a mask according to yet another exemplary embodiment of the present disclosure.

Referring to FIG. 5, in still another exemplary embodiment, a first diagonal line and a second diagonal line (not shown) of the substantially diamond-shaped evaporation hole 40 extend along the first direction and the second direction, respectively. Two of the four apexes in the first direction are chamfered into arc rounded corners, and the other two apexes in the second direction are chamfered in a straight cut-away manner. The evaporation hole 40 includes an included angle transition portion 42 in the second direction. The included angle transition portion 42 includes a first side 421, a second side 423, and a third side 425. The third side 425 is connected between the first side 421 and the second side 423, so that the opening range of the evaporation hole 40 in the second direction is reduced, the interval between the adjacent two evaporation holes 40 in the second direction becomes larger, which provides a wider transmission passage for the tensile force transmitted along the first direction, and improves the stability of the mask.

Specifically, the third side 425 is disposed parallel to the first direction, so that a contour boundary of the entire evaporation hole 40 is more regular, and the evaporation hole 40 is prevented from being wrinkled due to uneven force. In addition, a side length of a unchamfered evaporation hole 40 is D, and a length of the third side 425 is L. The length of the third side 425 is greater than 0.1 times of the side length D and less than 0.5 times of the side length D, that is, $0.1D<L<0.5D$, so that the length L of the third side 425 is within the value range to achieve a superior wrinkle-reducing effect. Optionally, the length L of the third side 425 is 5.31 μm, the first interval X2 is 1.49 μm, and the second interval Y2 is 7.23 μm.

Moreover, the evaporation hole 40 includes two opposite third rounded corners R3 in the first direction, and at least one of the two apexes of the evaporation hole 40 in the second direction may be chamfered into the included angle transition portion 42. For example, the apex on the left of the two apexes of the evaporation hole 40 in the second direction may be chamfered into the included angle transition portion 42. Alternatively, the apex on the right of the two apexes of the evaporation hole 40 in the second direction may be chamfered into the included angle transition portion 42. Both apexes of the evaporation hole 40 in the second direction may be chamfered into the included angle transition portions 42, and the two third sides 425 of the two included angle transition portions 42 have the same length. That is, the two opposite included angles of the diamond-shaped evaporation holes 40 in the second direction are chamfered, so that the evaporation hole 40 is symmetrical with respect to a centerline of the first direction, the contour boundary of the evaporation hole 40 is relatively regular, edges of the evaporation hole 40 is uniformly stressed, and the mask 200 is not easily wrinkled. The exemplary embodiments of the mask of the present disclosure are merely exemplary, and it should be understood by those skilled in the art that the technical features of the above exemplary embodiments may be arbitrarily modified or combined without mutual exclusion or contradiction. For example, the two openings of the evaporation hole 40 shown in FIG. 4 may have a positional relationship between the first opening 21 and the second opening 23 of the evaporation hole 20 shown in FIG. 1 or FIG. 2. In addition, the plurality of evaporation holes 40 shown in FIG. 4 also have a positional relationship between the evaporation holes 40 shown in FIG. 3. Moreover, the evaporation hole 40 shown in FIG. 4 may also have a structure or a shape of the evaporation hole 20 shown in FIG. 1 or FIG. 2.

The present disclosure further provides a display device manufactured by the aforementioned mask.

The present disclosure further provides a display panel, which includes a substrate, the aforementioned display device, and a packaging layer. The display device is disposed on the substrate, and the packaging layer is packaged outside the display device. The display device is protected by the packaging layer to prevent the display device from being corroded by water and oxygen.

The present disclosure further provides a display terminal including the above display panel.

Although the respective exemplary embodiments have been described one by one, it shall be appreciated that the respective exemplary embodiments will not be isolated. Those skilled in the art can apparently appreciate upon reading the disclosure of this application that the respective technical features involved in the respective exemplary embodiments can be combined arbitrarily between the respective exemplary embodiments as long as they have no collision with each other. Of course, the respective technical features mentioned in the same exemplary embodiment can also be combined arbitrarily as long as they have no collision with each other.

The foregoing descriptions are merely specific exemplary embodiments of the present disclosure, but are not intended to limit the protection scope of the present disclosure. Any variation or replacement readily figured out by a person skilled in the art within the technical scope disclosed in the present disclosure shall all fall within the protection scope of the present disclosure. Therefore, the protection scope of the present disclosure shall be subject to the protection scope of the appended claims.

The invention claimed is:

1. A mask, comprising:
an evaporation surface; and
a glass surface facing away from the evaporation surface, the mask being provided with a plurality of evaporation holes distributed in an array, the evaporation holes penetrating the evaporation surface and the glass surface, the evaporation holes comprising a first opening on the evaporation surface and a second opening on the glass surface, an orthographic projection of the first opening on the glass surface being a first projection opening, the first projection opening covering the second opening;
wherein an interval between the first projection opening and the second opening in a first direction of tensioning the mask is a first interval, an interval between the first projection opening and the second opening in a second direction perpendicular to the first direction being a second interval, the second interval being less than the first interval; and
wherein the plurality of evaporation holes is distributed in a plurality of rows, the second interval of evaporation holes in even rows is less than the first interval, the second interval of evaporation holes in odd rows is equal to the first interval.

2. The mask according to claim 1, wherein the evaporation holes comprise a first etching hole and a second etching hole, the first etching hole defines the first opening, the second etching hole defines the second opening; the first etching hole shrinks in a direction from the first opening towards the second opening, and the second etching hole shrinks in a direction from the second opening towards the first opening and is in communication with the first etching hole.

3. The mask according to claim 1, wherein:
the first opening comprises two first sides and two second sides, the two first sides being oppositely spaced apart from each other along the first direction, the two second sides being oppositely spaced apart from each other along the second direction and are connected between the two first sides;
the second opening has two third sides and two fourth sides, the two third sides being oppositely spaced apart from each other along the first direction, the two fourth sides being oppositely spaced apart from each other along the second direction and are connected between the two third sides; and
the first interval is between one of the first sides and one of the third sides in the first direction, the second interval being between one of the second sides and one of the fourth sides in the second direction.

4. The mask according to claim 3, wherein:
each evaporation hole further comprises a first inclined wall connected between one of the first sides and one of the third sides and a second inclined wall connected between one of the second sides and one of the fourth sides;
an inclination angle of the first inclined wall with respect to a thickness direction of the mask is a first inclination angle;
an inclination angle of the second inclined wall with respect to the thickness direction of the mask is a second inclination angle; and
the first inclination angle is greater than the second inclination angle.

5. The mask according to claim 1, wherein:
each of the second openings comprises a centerline parallel to the first direction,
a plurality of the second openings is distributed in the plurality of rows,
the centerlines of the second openings in the odd rows coincide,
the centerlines of the second openings in the even rows coincide, and
the centerlines of the second openings in the odd rows and the centerlines of the second openings in the even rows are staggered from each other in the second direction.

6. A mask comprising:
an evaporation surface; and
a glass surface facing away from the evaporation surface, the mask being provided with a plurality of evaporation holes distributed in an array, the evaporation holes penetrating the evaporation surface and the glass surface, the evaporation holes comprising a first opening on the evaporation surface and a second opening on the glass surface, an orthographic projection of the first opening on the glass surface being a first projection opening covering the second opening;
wherein:
an interval between the first projection opening and the second opening in a first direction of tensioning the mask is a first interval, an interval between the first projection opening and the second opening in a second direction perpendicular to the first direction being a second interval;
the plurality of evaporation holes is distributed in a plurality of rows, the second interval of evaporation holes in even rows being less than the first interval, the second interval of evaporation holes in odd rows being equal to the first interval; or
the second interval of evaporation holes in even rows is equal to the first interval, and the second interval of evaporation holes in odd rows is less than the first interval.

7. The mask according to claim 6, wherein the evaporation holes comprise a first etching hole and a second etching hole, and the second etching hole is in communication with the first etching hole.

8. The mask according to claim 7, wherein a cross-section of the first etching hole is a rectangular shape.

9. The mask according to claim 7, wherein the first etching hole defines the first opening, the second etching hole defines the second opening, and the first etching hole shrinks in a direction from the first opening towards the second opening.

10. A mask comprising:
a plurality of evaporation holes arranged in rows along a first direction and a second direction perpendicular to the first direction, each of the plurality of evaporation holes comprising a first opening on an evaporation surface and a second opening on a glass surface, an orthographic projection of the first opening on the glass surface being a first projection opening, the evaporation holes of adjacent two rows of evaporation holes in the first direction being staggered from each other in the second direction; and
an interval in the first direction between adjacent two evaporation holes in the first direction being less than an interval between adjacent two evaporation holes in the second direction;
wherein an interval between the first projection opening and the second opening in a first direction of tensioning the mask is a first interval, an interval between the first projection opening and the second opening in a second direction perpendicular to the first direction is a second interval, the second interval of evaporation holes in even rows is less than the first interval, and the second interval of evaporation holes in odd rows is equal to the first interval; and
wherein each of the plurality of evaporation holes comprises a center, a first rounded corner in the first direction and a second rounded corner in the second direction, a first distance between the first rounded corner and the center is greater than a second distance between the second rounded corner and the center.

11. The mask according to claim 10, wherein one of the evaporation holes has a diamond shape.

12. The mask according to claim 11, wherein the one of the evaporation holes has a chamfered diamond shape having two diagonal lines extending along the first direction and the second direction, respectively.

13. The mask according to claim 10, wherein a radius of curvature of the second rounded corner is greater than a radius of curvature of the first rounded corner.

14. The mask according to claim 13, wherein the radius of curvature of the second rounded corner is less than twice of the radius of curvature of the first rounded corner.

15. The mask according to claim 12, wherein the diamond-shaped evaporation hole is chamfered to have an included angle transition portion in the second direction, the included angle transition portion comprises a first side, a second side, and a third side, the first side and the second side are two adjacent sides of the diamond, and the third side connects the first side and the second side.

16. The mask according to claim 15, wherein the third side is disposed parallel to the first direction.

17. The mask according to claim 15, wherein a length of the third side is greater than 0.1 times of a side length of the diamond and less than 0.5 times of the side length of the diamond.

18. The mask according to claim 14, wherein the evaporation holes are chamfered to have an arc third rounded corner in the first direction.

\* \* \* \* \*